US010943951B2

United States Patent
Chen et al.

(10) Patent No.: US 10,943,951 B2
(45) Date of Patent: Mar. 9, 2021

(54) SPIN ORBIT TORQUE MAGNETIC RANDOM ACCESS MEMORY STRUCTURES AND METHODS FOR FABRICATION

(71) Applicant: National University of Singapore, Singapore (SG)

(72) Inventors: Jingsheng Chen, Singapore (SG); Jinyu Deng, Singapore (SG); Liang Liu, Singapore (SG)

(73) Assignee: National University of Singapore, Singapore (SG)

( * ) Notice: Subject to any disclaimer, the term of this patent is extended or adjusted under 35 U.S.C. 154(b) by 0 days.

(21) Appl. No.: 16/374,410

(22) Filed: Apr. 3, 2019

(65) Prior Publication Data

US 2019/0305042 A1    Oct. 3, 2019

(30) Foreign Application Priority Data

Apr. 3, 2018    (SG) .............................. 10201802787T

(51) Int. Cl.
*H01L 43/06*    (2006.01)
*H01L 27/22*    (2006.01)
*G11C 11/16*    (2006.01)
*H01L 43/10*    (2006.01)
(Continued)

(52) U.S. Cl.
CPC .......... *H01L 27/228* (2013.01); *G11C 11/161* (2013.01); *H01L 43/06* (2013.01); *H01L 43/08* (2013.01); *H01L 43/10* (2013.01); *H01L 43/14* (2013.01)

(58) Field of Classification Search
CPC ......... H01L 43/06; H01L 43/08; H01L 43/10; H01L 43/12; H01L 43/02; H01L 43/14
See application file for complete search history.

(56) References Cited

U.S. PATENT DOCUMENTS

| 5,801,984 A | 9/1998 | Parkin |
| 6,992,359 B2 | 1/2006 | Nguyen et al. |
| 9,105,832 B2 | 8/2015 | Buhrman et al. |
| (Continued) | | |

OTHER PUBLICATIONS

U.S. Appl. No. 16/265,451, filed Feb. 1, 2019 by Jongmin Lee et al. for Magnetic Memory and a Method of Operating Magnetic Memory, pp. 1-28.

(Continued)

*Primary Examiner* — Fernando L Toledo
*Assistant Examiner* — Valerie N Newton
(74) *Attorney, Agent, or Firm* — Cesari and McKenna, LLP; James A. Blanchette

(57) ABSTRACT

In one example embodiment, a SOT-MRAM includes a storage unit having a $Co_\alpha X_\beta Pt_\gamma$ based free layer. The storage unit includes a bottom electrode and the $Co_\alpha X_\beta Pt_\gamma$ based free layer is disposed over the bottom electrode. Further, the storage unit includes a tunnel barrier layer over the $Co_\alpha X_\beta Pt_\gamma$ based free layer, and a fixed layer over the tunnel barrier layer. The $Co_\alpha X_\beta Pt_\gamma$ based free layer, tunnel barrier layer and fixed layer form a magnetic tunnel junction. The storage unit may also include a top electrode over the MTJ.

20 Claims, 7 Drawing Sheets

(51) Int. Cl.
*H01L 43/08* (2006.01)
*H01L 43/14* (2006.01)

(56) References Cited

U.S. PATENT DOCUMENTS

| | | | |
|---|---|---|---|
| 9,741,414 | B2 | 8/2017 | Qiu et al. |
| 10,115,443 | B2 | 10/2018 | Yoon et al. |
| 2007/0063236 | A1 | 3/2007 | Huai et al. |
| 2014/0242418 | A1 | 8/2014 | Shukh |
| 2015/0340598 | A1* | 11/2015 | Gan .................. H01L 43/08 257/421 |
| 2018/0033956 | A1 | 2/2018 | Hyunsoo et al. |
| 2019/0058112 | A1 | 2/2019 | Chen et al. |
| 2019/0058113 | A1 | 2/2019 | Ramaswamy et al. |
| 2019/0304653 | A1* | 10/2019 | Oguz .................. H01F 10/3254 |

OTHER PUBLICATIONS

U.S. Appl. No. 16/356,889, filed Mar. 18, 2019 by Jongmin Lee et al. for Unipolar Switching of Magnetic Memory, pp. 1-43.
Choi, Gyung-Min, et al., "Perpendicular Magnetic Tunnel Junctions Having CoFeB/CoPt Alloy Layers," IEEE, IEEE Transactions on Magnetics, vol. 48, No. 3, Mar. 2012, pp. 1130-1133.
Fan, Yabin, et al., "Magnetization Switching Through Giant Spin-Orbit Torque in a Magnetically Doped Topological Insulator Heterostructure," Macmillan Publishers Limited, Nature Materials, vol. 13, No. 7, Apr. 28, 2014, pp. 1-7.
Fukami, Shunsuke, et al., "Magnetization Switching by Spin-Orbit Torque in an Antiferromagnet-Ferromagnet Bilayer System," Nature Materials, vol. 15, No. 5, Feb. 15, 2016, pp. 1-33.
Liu, Luqiao, et al., "Current-Induced Switching of Perpendicularly Magnetized Magnetic Layers Using Spin Torque from the Spin Hall Effect," American Physical Society, Physical Review Letters, vol. 109, Aug. 31, 2012, pp. 1-5.
Liu, Luqiao, et al., "Spin-Torque Switching with the Giant Spin Hall Effect of Tantalum," Science, Research Article, vol. 336, Issue 6081, May 4, 2012, pp. 555-558.
Mellnik, A.R., et al., "Spin-Transfer Torque Generated by a Topological Insulator," Macmillan Publishers Limited, Nature, Letter, vol. 511, No. 7510, Jul. 24, 2014, 449-451.
Oh, Young-Wan, et al., Field-Free Switching of Perpendicular Magnetization Through Spin-Orbit Torque in Antiferromagnet/Ferromagnet/Oxide Structures, Nature Nanotechnology, Jul. 11, 2016, vol. 11, No. 10, pp. 1-51.
Pai, Chi-Feng, et al., "Spin Transfer Torque Devices Utilizing the Giant Spin Hall Effect of Tungsten," Applied Physics Letters, Aug. 2012, vol. 101, No. 12, pp. 1-18.
Razavi, Seyed Armin, et al., "Joule Heating Effect on Field-Free Magnetization Switching by Spin-Orbit Torque in Exchange-Biased Systems," American Physical Society, Physical Review Applied, vol. 7, No. 2., Feb. 23, 2017, pp. 1-11.
Sin, Kyusik, et al., "Spin-Dependent Tunneling Junctions with Parallel Hard Bias for Read Heads," American Institute of Physics, Journal of Applied Physics, vol. 89, No. 11, Jun. 1, 2001, pp. 7359-7361.
Watanabe, Daisuke, et al., "Fabrication of MgO-based Magnetic Tunnel Junctions with CoCrPt Perpendicularly Magnetized Electrodes," American Institute of Physics, Journal of Applied Physics, vol. 105, No. 7, Feb. 6, 2009, pp. 1-4.

* cited by examiner

SPIN ORBIT TORQUE MAGNETIC RANDOM ACCESS MEMORY STRUCTURES AND METHODS FOR FABRICATION

CROSS-REFERENCE TO RELATED APPLICATIONS

The present application claims priority to Singapore Patent Application No. 10201802787T filed by Applicant National University of Singapore on Apr. 3, 2018, the contents of which are incorporated by reference herein in their entirety.

BACKGROUND

Technical Field

The present application relates generally to integrated circuits, and more specifically to spin orbit torque magnetic random access memory.

Background

Magnetic memory (e.g., magnetic random access memory (MRAM)) is a type of non-volatile memory technology with a high operation (i.e. read and write) speed. In contrast to other memory technologies, which use electric charges or current flow to store binary data and are therefore volatile, magnetic memory uses magnetic elements to store binary data, which do not degrade over time, giving non-volatile characteristics. In addition, magnetic memory exhibits low power consumption and is suited for high-speed operation. Accordingly, magnetic memory is a promising candidate for use as a universal memory (i.e. a memory that has multiple desirable properties typically only found in different memory types).

Generally, magnetic memory includes a magnetic storage unit that takes the form of a magnetic tunnel junction (MTJ). A MTJ generally includes a magnetically free layer and one magnetically fixed layer, separated by a thin insulating tunnel barrier layer. The MTJ may be a perpendicular MTJ (pMTJ), if the magnetization of the free layer and the fixed layers are oriented in a vertical direction (when the in-plane direction of the layers is considered a horizontal direction). The magnetization direction of the fixed layer is generally pinned in one direction, while that of the free layer is generally switchable between two stable states, e.g., pointing up or down. The tunnel magnetoresistance (TMR) of a MTJ is sensitive to the relative magnetization alignment between the free layer and the fixed layer. Using this property, binary information can be written by switching the magnetization direction of the free layer, and later read therefrom based on electrical resistance. For example, a high electrical resistance from an anti-parallel alignment between the free layer and the fixed layer can represent a binary "1", and a low electrical resistance from a parallel alignment between the free layer and the fixed layer can represent a binary "0".

In recent years, much attention has been given to the two-terminal MTJ with writing based on spin-transfer-torque (STT) switching. The integration of non-volatility, fast processing speed and endurance in spin-transfer-torque magnetic random access memory (STT-MRAM) has shown its potential as a future memory. However, STT-MRAM has disadvantages that limit its performance. For example, it requires a high current density for the writing process. Repeated application of a large writing current across a MTJ may cause the tunnel barrier to breakdown, which eventually destroys the MTJ. Further, in a typical SST-MRAM the reading and writing currents share the same path. As such, a STT-MRAM may suffer from the issue of read disturb, i.e. the inadvertent switching of the free layer from a reading current.

In an attempt to mitigate these issues, spin-orbit torque (SOT) writing schemes have been proposed. SOT switching is commonly observed in spin Hall material (SHM)/ferromagnetic material (MM) bilayer structures. A SHM is a type of material with strong spin orbit coupling, which includes heavy metals (such as platinum (Pt), thallium (Ta), tungsten (W), etc.), antiferromagnetic metals (such as iridium manganese alloy (IrMn), platinum manganese alloy (PtMn), etc.), and topological insulators (such as bismuth selenide ($Bi_2Se_3$), bismuth antimonide (Bi,Sb), etc.). By applying an in-plane current, an out-of-plane spin current with transverse polarization can be generated from the SHM layer due to strong spin orbit coupling. The spin current flows into the MM layer, and it exerts a torque perpendicular to the magnetization. In a device using perpendicular magnetic anisotropy (PMA) materials, an external in-plane field may be used to break the magnetic symmetry, in order to achieve deterministic switching. Alternatively, an in-plane exchange bias can be introduced to the MM in a device including an antiferromagnetic (AFM)/ferromagnetic (FM) bilayer structure such as an IrMn/boron doped cobalt-iron (CoFeB) bilayer structure, to achieve external field-free switching.

While such a bilayer structure may address the issue of external in-plane field to make SOT-MRAMs more practical, it has its own disadvantages. For example, the thickness of the ferromagnetic layer generally needs to be kept thin, as current density of switching is proportional to the thickness. Further, low interfacial PMA often cannot be maintained when the size of device scales below 20 nm. Still further, Joule heating may degrade field-free switching in an antiferromagnetic/ferromagnetic system.

It would be desirable if current-induced torque could be generated in a single FM layer due to spin orbit interaction (SOI). The thickness constraint would no longer exist in such a single layer system. By simply increasing the thickness of the FM layer, thermal stability could be enhanced to allow for a further reduction in device size, while having a minimal negative effect on the switching current density. However, finding a suitable ferromagnetic material that has strong spin orbit interaction as well has proven challenging.

Yet even if this hurdle can be overcome, other challenges are also presented. A typical SOT-MRAM uses in-plane (horizontal) electrical current to switch the magnetization of the free layer of pMTJ. Specifically, when an in-plane current is applied in the free layer, it can induce a Slonczewski-like spin orbit torque on the perpendicular magnetization, causing the reversal of magnetization. This requires a carefully chosen material to be used for storage in the free layer.

Accordingly, there is a need improved storage materials that may be used, for example, in SOT-MRAM, that address some or all of the above described shortcomings and challenges.

SUMMARY

In one example embodiment, a SOT-MRAM includes a storage unit having a $Co_\alpha X_\beta Pt_\gamma$ based free layer. The storage unit includes a bottom electrode and the $Co_\alpha X_\beta Pt_\gamma$ based free layer is disposed over the bottom electrode. Further, the storage unit includes a tunnel barrier layer over the $Co_\alpha X_\beta Pt_\gamma$ based free layer, and a fixed layer over the tunnel barrier layer. The $Co_\alpha X_\beta Pt_\gamma$ based free layer, tunnel barrier layer and fixed layer form a MTJ. The storage unit may also include a top electrode over the MTJ.

It should be understood that a variety of additional features and alternative embodiments may be implemented other than those discussed in this Summary. This Summary is intended simply as a brief introduction to the reader, and does not indicate or imply that the examples mentioned herein cover all aspects of the disclosure, or are necessary or essential aspects of the disclosure.

BRIEF DESCRIPTION OF THE DRAWINGS

The description below refers to the accompanying drawings of example embodiments, of which.

DETAILED DESCRIPTION

Definitions

As used herein, the term "on", in the context of a first layer or element being "on" a second layer or element, should be interpreted to mean that the first layer or element is directly in contact with the second layer or element.

As used herein, the terms "perpendicular" and "out-of-plane direction", in the context of a storage unit or other device stack comprising a number of layers, should be understood to refer to a direction that is at a right angle to the storage unit or at a right angle to a plane of the layers of the device stack.

Further, it should be understood that herein spatially relative terms, such as "over", "upper", "under", "lower", in the context of describing a first layer or element's relationship to a second layer or element, embrace configurations where the first layer or element is directly in contact with the second layer or element, or where intervening layers or elements may be presented in between. To the extent spatially relative terms require a reference orientation, it should be understood that the reference orientation is one where the location of a top electrode defines an "up" direction and the location of a bottom electrode defines a "down" direction. It should be understood that a magnetic memory, such as a SOT-MRAM, may be placed in any orientation in space (e.g., by flipping it over), and that whatever orientation the top electrode and bottom electrode are placed in defines "up" and "down", and thereby whether layers or elements are "over", "upper", "under", "lower" each other.

Example Embodiments

Example embodiments herein described an improved MTJ-based storage unit that may be used in magnetic memory, such as a SOT-MRAM. The storage unit includes a bottom electrode, a free layer over the bottom electrode, a tunnel barrier layer over the free layer, a fixed layer over the tunnel barrier layer and a top electrode over the fixed layer. A storage layer of the free layer may be made from $Co_\alpha X_\beta Pt_\gamma$ alloy, where X is a transition metal or more specifically X is copper (Cu), nickel (Ni), manganese (Mn), or chromium (Cr), and $\alpha$, $\beta$, and $\gamma$ are integers, or more specifically $\alpha$ is an integer that ranges from 20 to 50, $\beta$ is an integer that ranges from 0 to 30, and $\gamma$ is an integer that ranges from 40 to 60, with the proviso that $\alpha+\beta+\gamma=100$. To achieve magnetic anisotropy and magnetization, the $Co_\alpha X_\beta Pt_\gamma$ storage layer can be formed as a thin film on single crystal substrates, such as a MgO, $SrTiO_3$, $LaAlO_3$, $Al_2O_3$ substrate, or on a textured intermediate layer, such as a Ru, Pt, or Ir intermediate layer.

Figure 1:
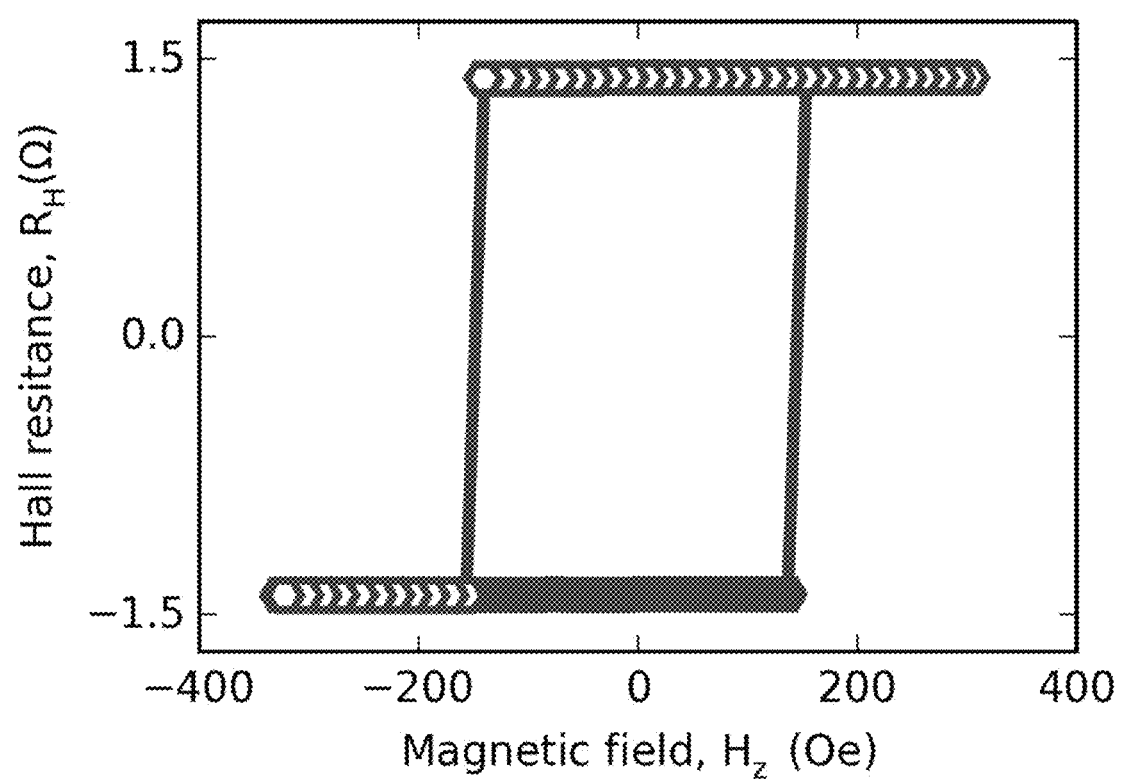
FIG. 1 is a graph that shows an example anomalous Hall Effect (AHE) loop for a 10 nm textured $Co_{40}Cu_{10}Pt_{50}$ thin film grown on a magnesium oxide (MgO) single crystal substrate.

The magnetization of a single $Co_\alpha X_\beta Pt_\gamma$ layer can be switched through SOT without any external field. For purposes of illustrating this property, a single layer of 10 nm thick $Co_{40}Cu_{10}Pt_{50}$ thin film grown on an MgO single crystal substrate may be patterned into q Hall bar device for electrical measurement. FIG. 1 is a graph that shows example an AHE loop for such a device. As shown in FIG. 1, the AHE measurement indicates that the device exhibits PMA with good squareness. When an in-plane current IDC is applied in the $Co_{40}Cu_{10}Pt_{50}$ thin film, the induced Slonczewski-like spin orbit torque is exerted on its own perpendicular magnetization. When $I_{DC}$ is large enough, the magnetization will be switched to its opposite direction.

Figure 2:
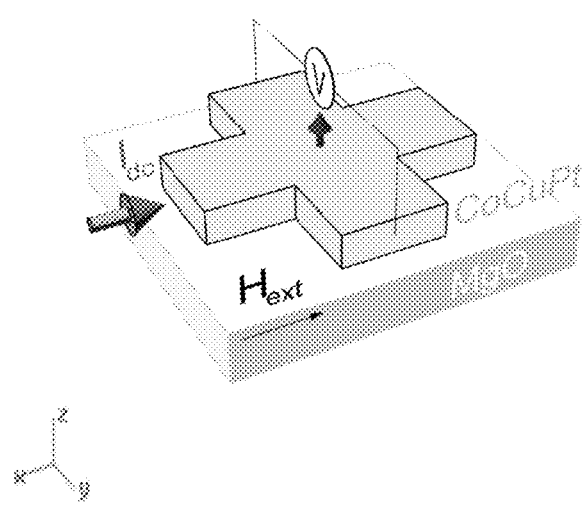
FIG. 2 is a schematic drawing of an example Hall bar device and a graph showing current-induced SOT switching loops of a 10 nm $Co_{40}Cu_{10}Pt_{50}$/MgO sample under various external field $H_x$.
Figure 2:
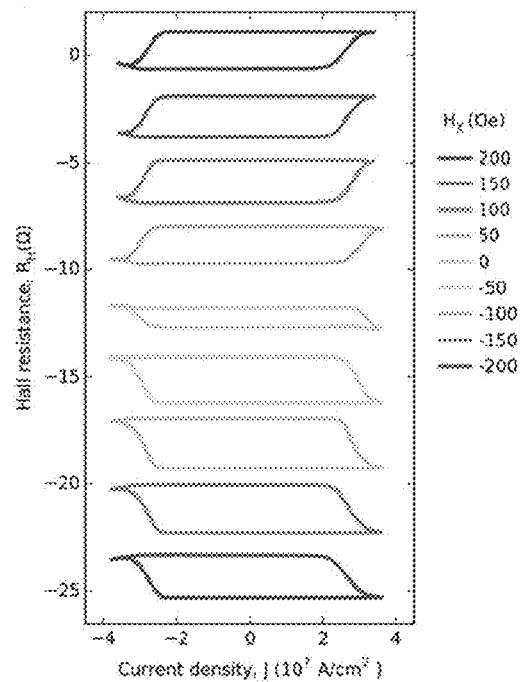

Deterministic switching of the example of the example Hall bar device may be achieved under external longitudinal field ($H_x$). FIG. 2 is a schematic drawing of an example Hall bar device and a graph showing current-induced SOT switching loops of a 10 nm $Co_{40}Cu_{10}Pt_{50}$/MgO sample under various external field $H_x$.

Figure 3:
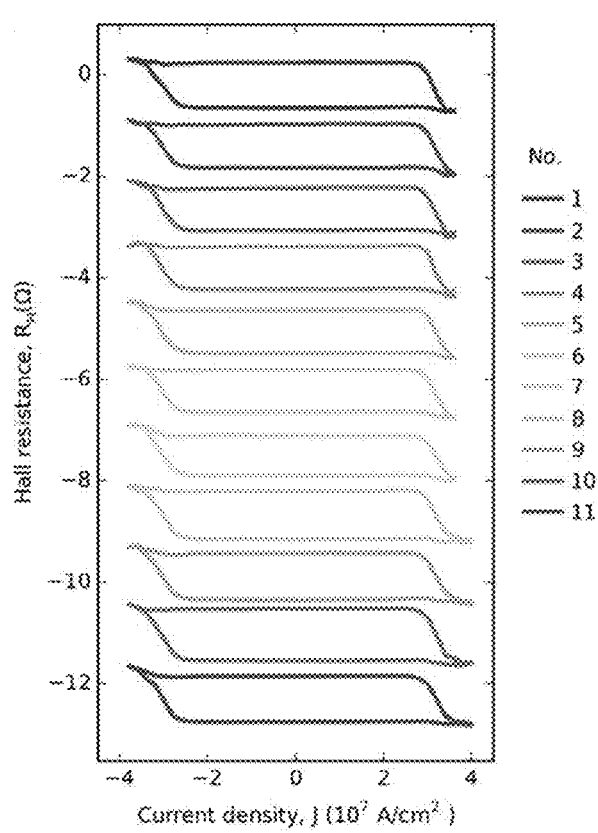
FIG. 3 is field-free current-induced SOT switching loops of a 10 nm $Co_{40}Cu_{10}Pt_{50}$/MgO sample repeating for 11 times.
Figure 3:
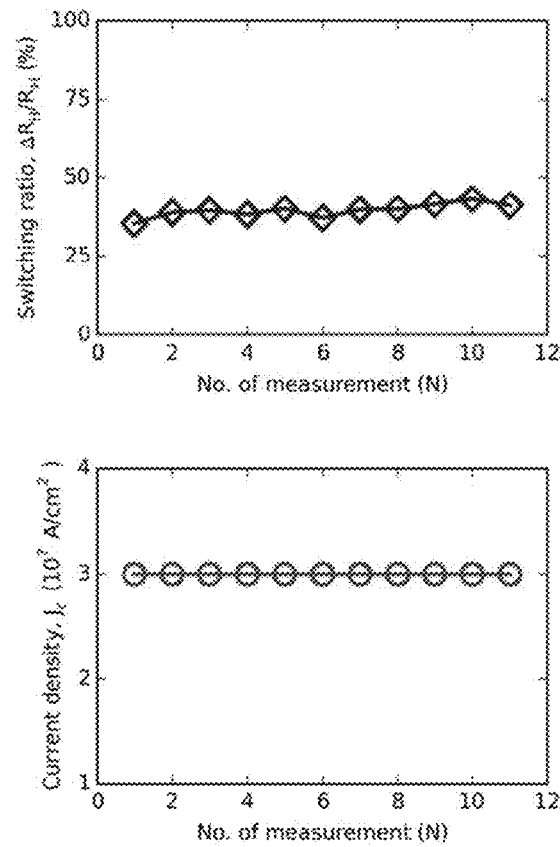

Deterministic switching can be retained without external field (i.e. $H_x$=0 Oe). FIG. 3 is field-free current-induced SOT switching loops of a 10 nm $Co_{40}Cu_{10}Pt_{50}$/MgO sample repeating for 11 times. As shown in FIG. 3, the field free switching of the device can be repeated multiple times, and no degradation is observed.

Figure 4:
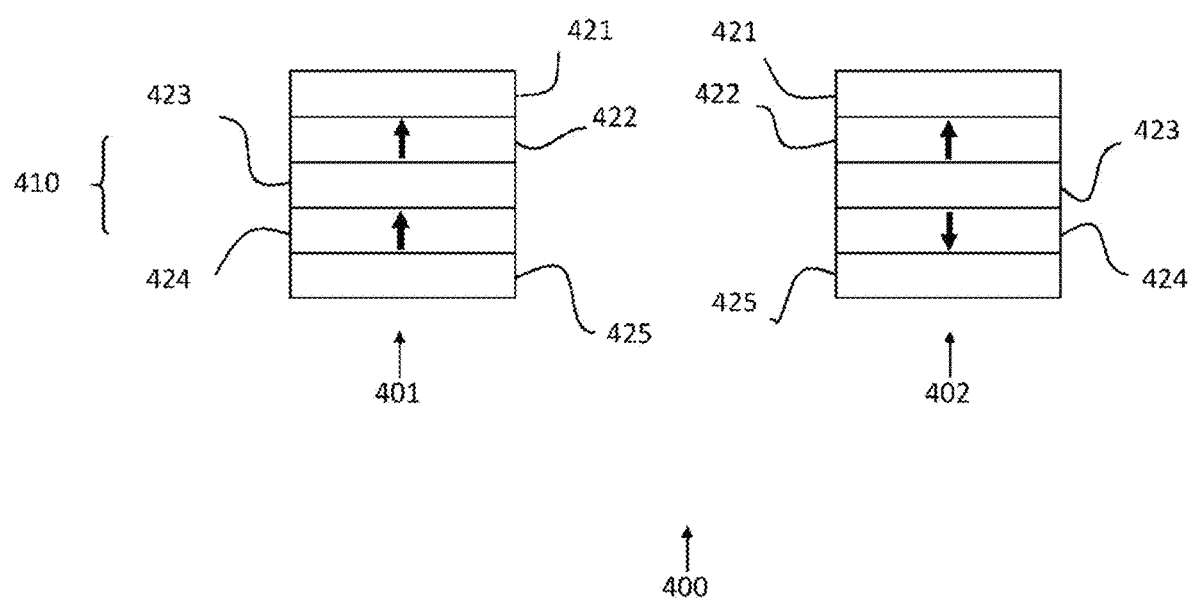
FIG. 4 is a pair of simplified example diagrams illustrating a parallel state and anti-parallel state of a top fixed perpendicular MTJ element of a magnetic memory, such as a SOT-MRAM.

FIG. 4 is a pair of simplified example diagrams illustrating a parallel state 401 and anti-parallel state 402 of a top fixed perpendicular MTJ element 400 of a magnetic memory, such as a SOT-MRAM. The MTJ 400 includes an example pMTJ element or stack 410 positioned between a bottom electrode 425 and a top electrode 421. The MTJ 400 has the bottom electrode 425 proximal to a substrate, which is not shown in the drawing, while the top electrode 421 is distal from the substrate.

The example pMTJ stack 410 includes a magnetically fixed (pinned) layer 422, a tunnel barrier layer 423, and a magnetically free layer 424. In one embodiment, the fixed layer 422 is positioned above the free layer 424, forming a top pinned pMTJ stack 410. The magnetic orientation of the fixed layer 422 (represented by the black arrow in the figure) is fixed in a perpendicular direction pointing upwards. The magnetic orientation of the fixed layer 422 can be also fixed in a perpendicular direction pointing downwards in alternative embodiments. The magnetic orientation of free layer 424 may be programmed to be in the same direction as fixed layer 422 (state 401) or in an opposite direction as fixed layer 422 (state 402). The parallel arrangement of magnetization in state 401 gives an electrical resistance across the pMTJ stack 410 that is denoted as $R_p$, while the anti-parallel arrangement of magnetization in state 402 gives another electrical resistance that is denoted as $R_{ap}$. The resistance $R_{ap}$ is higher than the resistance $R_p$.

Figure 5:
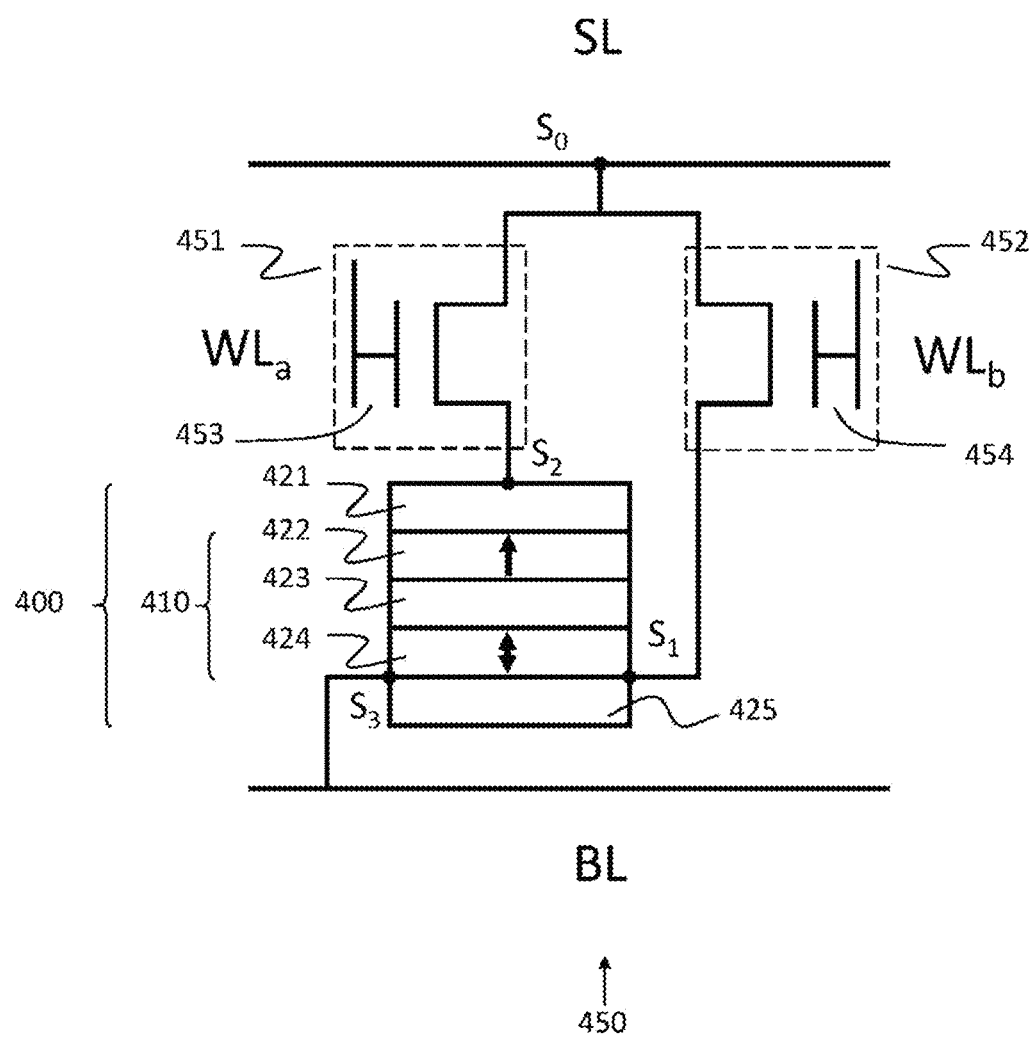
FIG. 5 is a schematic diagram of an example non-volatile magnetic memory cell, for example, an SOT-MRAM memory.

FIG. 5 is a schematic diagram of an example non-volatile magnetic memory cell 450, for example, an SOT-MRAM memory cell. It should be understood, however, that the techniques herein also be applicable to other types of memory structures. As shown in FIG. 5, the memory cell 450 includes a top pinned pMTJ 400 as described above in connection with FIG. 4. The pMTJ 400 includes a pMTJ element or stack 410 positioned between a bottom electrode 425 and a top electrode 421. The pMTJ stack 410 includes a magnetically fixed (pinned) layer 422, a tunnel barrier layer 423, and a magnetically free layer 424.

In FIG. 5, the bottom electrode 425 and the free layer 424 of the top pinned pMTJ 400 are connected to a bit line (BL) and the node $S_3$ is the connection point. Two cell selector units 451 and 452, for example, select transistors, are provided for selecting the memory cell 450. Cell selector unit 451 is connected to the top electrode 521 of the top pinned pMTJ 400, and the node S2 is the connection point. Cell selector unit 452 is connected to the bottom electrode 425 and the magnetically free layer 424 of the top pinned pMTJ 400, and the node $S_1$ is the connection point. The cell selector units 451 and 452 are both connected to a source line (SL) and the node $S_0$ is the connection point. In one embodiment, the cell selector units 451 and 452 are each a metal oxide semiconductor (MOS) transistor, such as an n-type MOS transistor, and each include a gate or control terminal. Gate terminal 453 of the cell selector unit 451 is connected to a wordline that is denoted as $WL_a$, and the gate terminal 454 of the cell selector 452 is connected to another wordline that is denoted as $WL_b$. Other configurations of the structure may also be possible.

In one embodiment, during the writing process, the path for writing current is SL→$S_0$→$S_1$→$S_3$→BL; during the reading process, the path for reading current is SL→$S_0$→$S_2$→$S_3$→BL. In such configuration, the writing path and the read path are separated.

Figure 6:
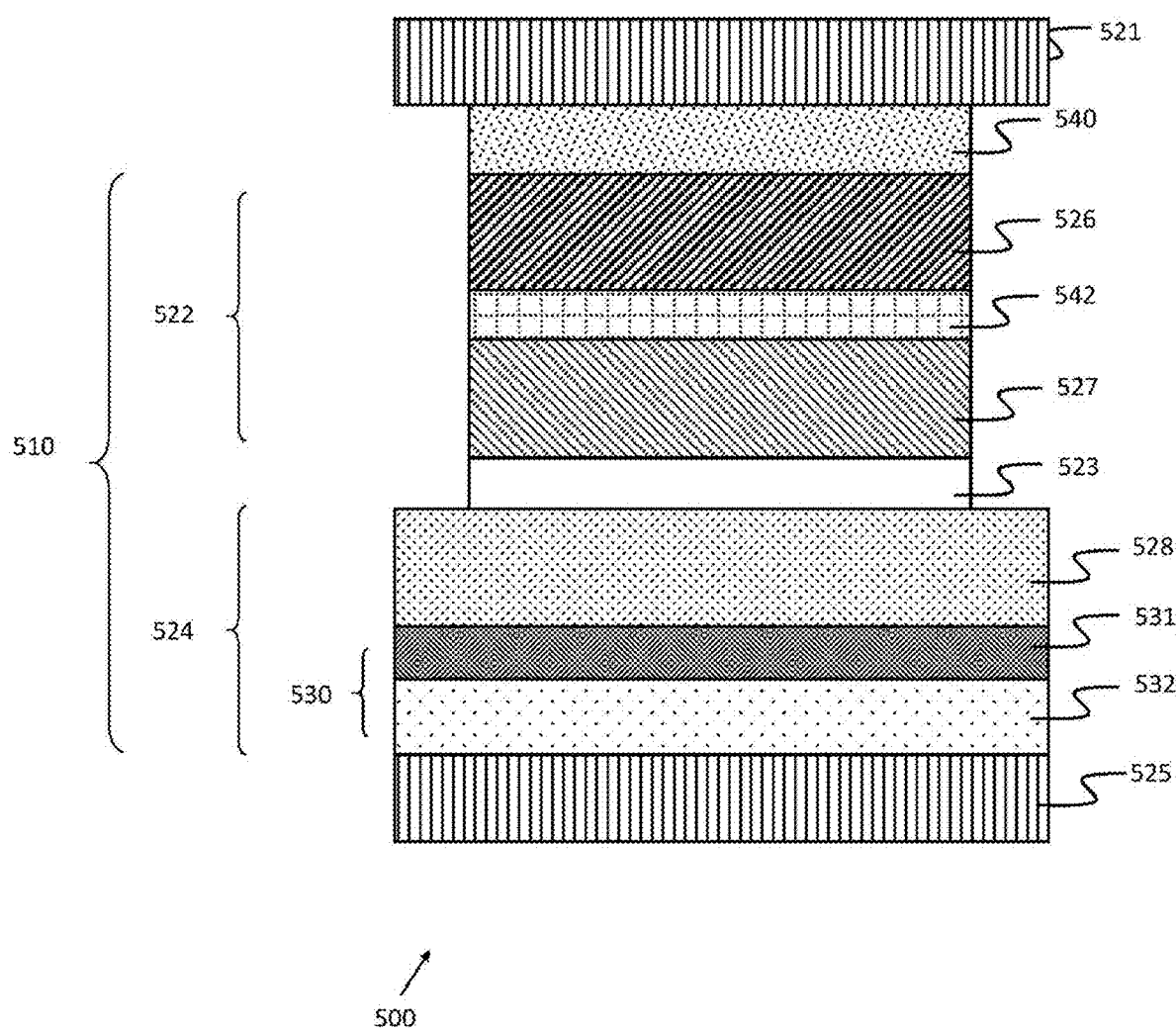
FIG. 6 is a cross-sectional view of a first example storage unit that may be used in a magnetic memory cell, for example, an SOT-MRAM memory cell.

FIG. 6 is a cross-sectional view of a first example storage unit 500 that may be used in a magnetic memory cell, for example, an SOT-MRAM memory cell. In one embodiment, the storage unit 500 includes an MTJ structure as a top pinned pMTJ stack 510 positioned between a top electrode 521 and a bottom electrode 525. The pMTJ stack 510 includes a fixed layer 522, a free layer 524 and a tunnel barrier layer 523 disposed between the fixed layer 522 and the free layer 524. A capping layer 540 is positioned over the fixed layer 522. The fixed layer 522, tunnel barrier layer 523, and the free layer 524 form the pMTJ stack 510.

The bottom electrode 521 and top electrodes 525 may be formed of a conductive material, such as tantalum (Ta), Ti, Cu, W, gold (Au), tantalum nitride (TaN), titanium nitride (TiN) or a combination thereof. The bottom electrode 521 and the top electrode 525 may be made of the same or different materials. The thickness of the bottom electrode 521 and the top electrode 525 may be from 1 to 100 nm.

The various layers of the pMTJ stack 510 are hereafter described in an order upward from the bottom electrode 525.

A free layer 524 is positioned on the bottom electrode 525. In one embodiment, the free layer 524 includes a base layer 530, and a storage layer 528. As shown in FIG. 6, the base layer 530 is positioned on the bottom electrode 525 and the storage layer 528 is positioned on the base layer 530. A tunnel barrier layer 523 is positioned over the free layer 524. A fixed layer 522 is positioned over the tunnel barrier layer 523. In one embodiment, the fixed layer 522 includes a reference layer 527, a spacing layer 542, and a magnetically hard layer 526. The reference layer 527 is positioned on the tunnel barrier layer 523, the spacing layer 542 is positioned on the reference layer 527, and the hard layer 526 is positioned on the spacing layer 542. The spacing layer 542 may be optional, such that if not included the hard layer 526 is positioned directly on the reference layer 527.

The base layer 530 may promote orientation of the storage layer 528 in a desired crystal structure that has PMA. In one embodiment, the base layer 530 promotes face-centered-cubic (FCC) or rhombohedral crystal structure of the $Co_\alpha X_\beta Pt_\gamma$ (X=Cu, Ni, Mn, Cr) based storage layer 528, or a hexagonal-close-packed (HCP) crystal structure of the $Co_\alpha X_\beta Pt_\gamma$ (X=Cu, Ni, Mn, Cr) based storage layer 528.

In one embodiment, the base layer 530 includes an optional wetting layer 532 and a seed layer 531. If the wetting layer 532 is used, it may be positioned on the bottom electrode 525, and the seed layer 531 may be positioned on the wetting layer 532. The wetting layer 532 may provide adhesion between the bottom electrode 525 and the seed layer 531. An example wetting layer 532 has a body-centered-cubic (BCC), FCC or HCP structure. The wetting layer 532 can promote and enhance a BCC, FCC or HCP structure of the seed layer 531. The wetting layer 532 can be made of magnesium (Mg), hafnium (Hf), titanium (Ti), Ta or a combination thereof. Other materials may also be used. The thickness of the wetting layer 532 may be from 1 A to 50 A. The wetting layer 532 may be formed by physical vapor deposition (PVD).

As shown in FIG. 6, the seed layer 531 may be positioned on the wetting layer 532. As mentioned above, the wetting layer 532 may not be present in certain embodiments, such that the seed layer 531 may be positioned directly on the bottom electrode 525. The seed layer 531 may have a BCC, FCC, rhombohedral or HCP structure. An example seed layer 531 is textured ruthenium (Ru), Pt, iridium (Jr), Cu, Hf, Ta or W. Other suitable types of BCC, FCC, rhombohedral or HCP layers or multiple bilayers may also be used as the seed layer 531 as long as these layers promote FCC or rhombohedral crystal structure of the $Co_\alpha X_\beta Pt_\gamma$ (X=Cu, Ni, Mn, Cr) based storage layer 528, or a HCP crystal structure of the $Co_\alpha X_\beta Pt_\gamma$ (X=Cu, Ni, Mn, Cr) based storage layer 528. The thickness of the seed layer 531 may be from 1 A to 100 A. The seed layer 531 may be formed by PVD.

In FIG. 6, the storage layer 528 is formed on the base layer 530. The storage layer 528 is $Co_\alpha X_\beta Pt_\gamma$ (X=Cu, Ni, Mn, Cr) alloy, wherein α ranges from 20 to 50, β ranges from 0 to 30, and γ ranges from 40 to 60, with the proviso that α+β+γ=100. An example storage layer 528 is $Co_{40}Cu_{10}Pt_{50}$ alloy, which is ferromagnetic. In one embodiment, the storage layer 528 has a FCC or rhombohedral crystal structure along (111) orientation or a HCP crystal structure along (0002) orientation such that it exhibits PMA. The thickness of the storage layer 528 may be from 20 A to 100 A. The storage layer 528 may be formed by PVD at a temperature range from 150° C. to 450° C. The storage layer 528 may also be formed using other techniques or processes as well.

The tunnel barrier layer 523 is positioned over the free layer 524. An example tunnel barrier layer 523 may be an MgO layer. Other suitable types of tunnel barrier layers 523 may also be used. The thickness of the tunnel barrier layer 523 may be from 1 A to 20 A. The tunnel barrier layer 523 may be formed by PVD or using other techniques or processes.

As shown in FIG. 6, the reference layer 527 is positioned on the tunnel barrier 523. The reference layer 527 may be a magnetic layer or multilayer with PMA. An example reference layer 527 is a CoFeB layer. Other materials that exhibit PMA may also be used. The thickness of the reference layer 527 may be from 5 A to 100 A. The reference layer 527 may be formed by PVD or using other techniques or processes.

The (optional) spacing layer 542 is positioned on the reference layer 527 to serve as a texture breaking layer. The spacing layer 542 facilitates a different texture or crystal orientation for the hard layer 526, if necessary. For example, the spacing layer 542 promotes a FCC crystal structure of the hard layer 526 along (111) orientation when deposited. The thickness of the spacing layer 542 may be from 0 A to 10 A. The spacing layer 542 may be formed by PVD or using other techniques or processes.

In one embodiment, the hard layer 526 is positioned on the spacing layer 542. The hard layer 526 may be an antiferromagnetic layer. The hard layer 526 serves to fix (or pin) the magnetization of the reference layer 527 in a perpendicular direction through an exchange bias. The hard layer 526 may be FeMn, IrMn, PtMn or NiO, FeO, CoO, MnO or synthetic antiferromagnetic (SAF) layer formed by PVD or using other techniques or processes.

A capping layer 540 is provided over the hard layer 526. The capping layer 540 serves to prevent top electrode diffusion through the hard layer 526 or the reference layer 527. The capping layer 540 may be a Ru layer or a Ta layer formed by PVD or using other techniques or processes.

Figure 7:
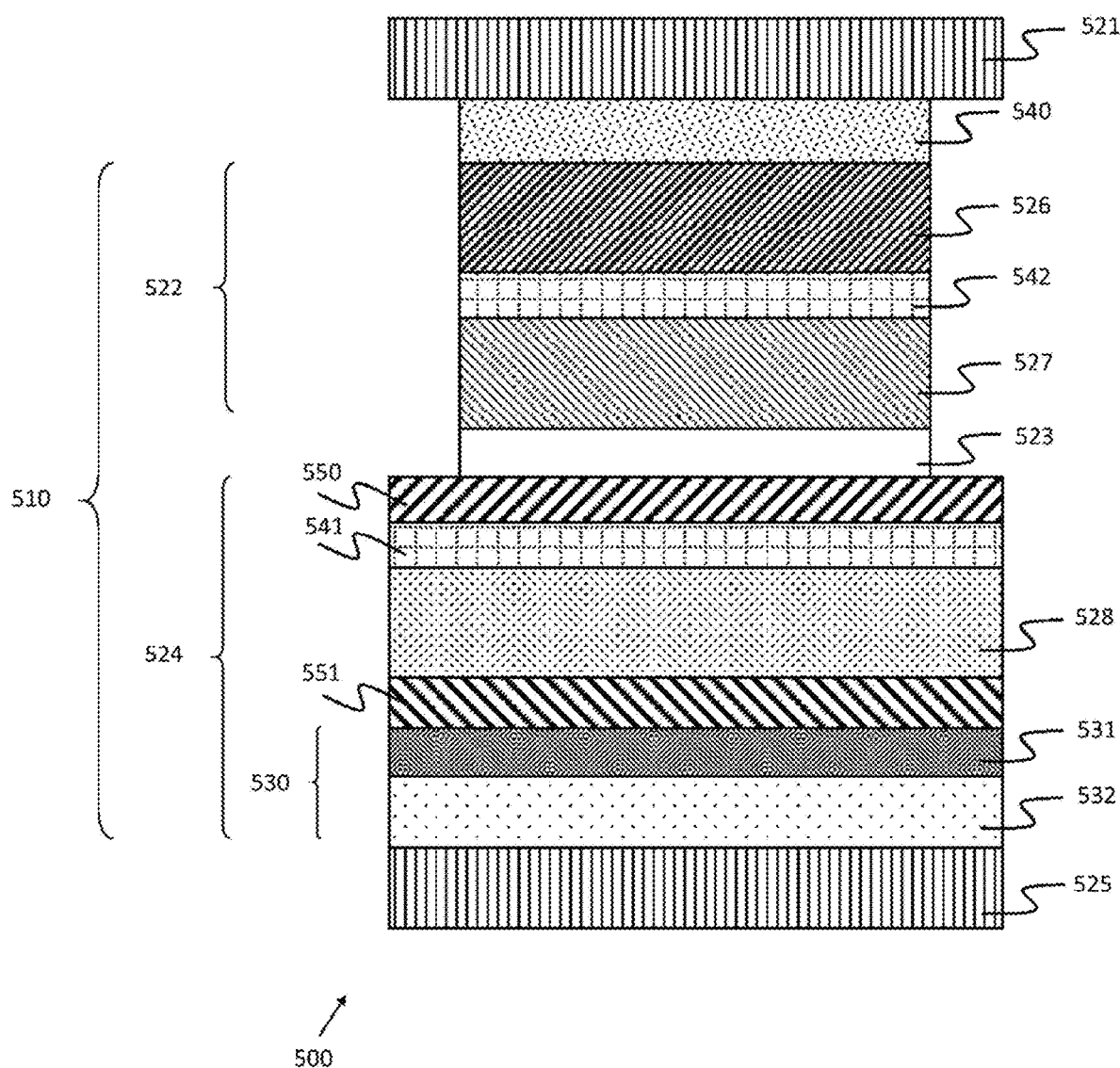
FIG. 7 is a cross-sectional view of a second example storage unit that may be used in a magnetic memory cell, for example, an SOT-MRAM memory cell.

FIG. 7 is a cross-sectional view of a second example storage unit that may be used in a magnetic memory cell, for example, an SOT-MRAM memory cell. In the embodiment of FIG. 7, the magnetic storage unit 500 still includes a top pinned pMTJ stack as an MTJ structure 510 positioned between top and bottom electrodes 521 and 525. In contrast to the magnetic storage unit 500 of FIG. 6, the magnetic storage unit 500 of FIG. 7 includes a (optional) second storage layer 550 together with a (optional) spacing layer 541, and a (optional) spin Hall layer 551. The spacing layer 541 is positioned above the storage layer 528, and the second storage layer 550 is positioned between the tunnel barrier layer 523 and the spacing layer 541. The spin Hall layer 551 is positioned between the storage layer 528 and the seed layer 531. It should be understood that both the second storage layer 550 and the spin Hall layer 551 are optional, and each of them can be added or removed independently. The other layers in FIG. 7 are the same as in FIG. 6.

The spacing layer 541 is positioned above the storage layer 528 and serves as a texture breaking layer. The spacing layer 541 facilitates a different texture or crystal orientation for the tunnel barrier layer 523, if necessary. For example, the spacing layer 541 enables the second storage layer 550 to be amorphous when deposited. The thickness of the spacing layer 541 may be from 0 A to 10 A. The spacing layer 541 may be formed by PVD.

The second storage layer 550 is positioned between the tunnel barrier layer 523 and the spacing layer 541. The second storage layer 550 may be a ferromagnetic layer. In one embodiment, the second storage layer 550 is a CoFeB layer, however it also may be constructed of another material such as cobalt doped cobalt-iron (CoFeC), or aluminum doped cobalt-iron (CoFeAl). The second storage layer 550 serves to enhance TMR by creating a second storage layer 550/tunnel barrier layer 523 interface, for example, a CoFeB/MgO interface. If the second storage layer 550 is used, the thickness of the (optional) spacing layer 541 may be thin enough to ensure the exchange coupling between the second storage layer 550 and the storage layer 528. The second storage layer 550 may be formed by PVD.

The spin Hall layer 551 may be positioned between the storage layer 528 and the seed layer 531 and serves to enhance the SOT switching of the storage layer 528. The spin Hall layer 551 may be made from a spin Hall material such as Pt or Ir. The spin Hall layer 551 may also be made from an anti-ferromagnetic material that has strong spin-orbit interaction, such as IrMn, PtMn or FeMn. If such anti-ferromagnetic material is used as the spin Hall layer 551, the deterministic field free SOT switching of the magnetization of the storage layer 528 can be enhanced by an in-plane exchange bias. The in-plane exchange bias can be introduced to the magnetic storage layer 528 through an annealing process with the presence of an in-plane magnetic field. Alternative methods can also be used to induce the exchange bias. The spin Hall layer 551 may be formed by PVD.

The embodiments described herein may yield various advantages over existing techniques. In the embodiments as described herein, the writing path and reading path of the SOT-MRAM may be separated, thereby avoiding tunnel barrier damaging and read disturb issues. A $Co_\alpha X_\beta Pt_\gamma$ (X=Cu, Ni, Mn, Cr) alloy may be used as the storage layer material to ensure that the magnetization can be switched by the in-plane current through SOT, with neither an external field nor an exchange bias being required for the deterministic SOT switching in this alloy. Thermal stability can be preserved when the device size is below 20 nm, and by simply increase the thickness of the $Co_\alpha X_\beta Pt_\gamma$ layer thermal stability can be further enhanced. The energy consumption per unit volume of material to switch the magnetization is low as compared with a similar heavy metal/ferromagnetic (HM/FM) bilayer system such as Pt/CoFeB.

In summary, example embodiments of the present disclosure describe a magnetic memory, such as a SOT-MRAM, that includes a storage unit having a $Co_\alpha X_\beta Pt_\gamma$ based free layer. It should be understood that various adaptations and modifications may be made to the above-discussed techniques. Various elements described above may be made from differing materials, implemented in different combinations or otherwise formed or used differently without departing from the intended scope of the disclosure. Example embodiments are not necessarily mutually exclusive as some may be combined with one or more embodiments to form new example embodiments. Figures are not drawn to scale and relative relationships in size may be exaggerated for clarity in presentation.

It will be appreciated by a person skilled in the art that other variations and/or modifications may be made to the specific embodiments without departing from the scope of the invention. The present embodiments are, therefore, to be considered in all respects to be illustrative and not restrictive.

What is claimed is:

1. A spin orbit torque magnetic random access memory (SOT-MRAM), having a magnetic storage unit that comprises:
   a bottom electrode;

a free layer, wherein the free layer includes a storage layer of $Co_\alpha X_\beta Pt_\gamma$, where X is a transition metal, and $\alpha$, $\beta$, and $\gamma$ are integers, which is switchable via in-plane current through SOT;

a fixed layer;

a tunnel barrier layer between the free layer and the fixed layer, wherein the fixed layer, the free layer and the tunnel barrier layer form a magnetic tunnel junction (MTJ); and a top electrode.

2. The SOT-MRAM of claim 1, wherein the free layer is over the bottom electrode, the tunnel barrier is layer over the free layer, the fixed layer is over the tunnel barrier and the top electrode is over the MTJ, and the magnetic storage unit further comprises:

a base layer between the bottom electrode and the free layer that promotes a face-centered-cubic (FCC) or rhombohedral crystal structure of the $Co_\alpha X_\beta Pt_\gamma$.

3. The SOT-MRAM of claim 2, wherein the base layer includes a seed layer that directly contacts the free layer and is constructed from a material selected from a group consisting of: textured ruthenium (Ru), platinum (Pt), iridium (Jr), copper (Cu), hafnium (Hf), tantalum (Ta) and tungsten (W).

4. The SOT-MRAM of claim 3, wherein the base layer includes a wetting layer that directly contacts the seed layer and the bottom electrode, which provides adhesion between the bottom electrode and the seed layer.

5. The SOT-MRAM of claim 1, wherein the X in $Co_\alpha X_\beta Pt_\gamma$ is copper (Cu), nickel (Ni), manganese (Mn), or chromium (Cr).

6. The SOT-MRAM of claim 5, wherein $\alpha$ ranges from 20 to 50, $\beta$ ranges from 0 to 30, and $\gamma$ ranges from 40 to 60, and $\alpha+\beta+\gamma=100$.

7. The SOT-MRAM of claim 1, wherein the fixed layer includes a reference layer that is a magnetic layer or multilayer having perpendicular magnetic anisotropy (PMA).

8. The SOT-MRAM of claim 7, wherein the fixed layer includes a magnetically hard layer that serves to fix magnetization of the reference layer in a perpendicular direction through an exchange bias.

9. The SOT-MRAM of claim 8, wherein the fixed layer includes a spacing layer between the magnetically hard layer and the reference layer.

10. The SOT-MRAM of claim 1, wherein the free layer further includes:

a second storage layer; and a spacing layer.

11. The SOT-MRAM of claim 10, further wherein the second storage layer is a ferromagnetic layer, and wherein the spacing layer is between the storage layer and ferromagnetic layer.

12. The SOT-MRAM of claim 11, wherein the ferromagnetic layer is constructed from a material selected from the group consisting of boron doped cobalt-iron (CoFeB), cobalt doped cobalt-iron (CoFeC) and aluminum doped cobalt-iron (CoFeAl).

13. The SOT-MRAM of claim 1, further comprising a spin Hall layer between the storage layer and the bottom electrode that provides an in-plane exchange bias.

14. The SOT-MRAM of claim 13, wherein the spin Hall layer is constructed of a material selected from the group consisting of Pt and Ir.

15. The SOT-MRAM of claim 13, wherein the spin Hall layer is an antiferromagnetic layer that is constructed from a material selected from the group consisting of FeMn, PtMn and IrMn.

16. A spin orbit torque (SOT) switchable magnetic tunnel junction (MTJ), comprising:

a free layer, wherein the free layer includes a storage layer of $Co_\alpha X_\beta Pt_\gamma$, where X is a transition metal, and $\alpha$, $\beta$, and $\gamma$ are integers, which is switchable via in-plane current through SOT;

a fixed layer; and a tunnel barrier layer between the free layer and the fixed layer.

17. The SOT switchable MTJ of claim 16, wherein the X in $Co_\alpha X_\beta Pt_\gamma$ is copper (Cu), nickel (Ni), manganese (Mn), or chromium (Cr).

18. The SOT switchable MTJ of claim 17, wherein $\alpha$ ranges from 20 to 50, $\beta$ ranges from 0 to 30, and $\gamma$ ranges from 40 to 60, and $\alpha+\beta+\gamma=100$.

19. A method for fabricating a spin orbit torque magnetic random access memory (SOT-MRAM) having a magnetic storage unit, comprising:

forming a bottom electrode;

forming a seed layer;

forming a storage layer at a temperature range from 150° C. to 450° C., wherein the storage layer comprises $Co_\alpha X_\beta Pt_\gamma$, wherein X is copper (Cu), nickel (Ni), manganese (Mn), or chromium (Cr), and $\alpha$, $\beta$, and $\gamma$ are integers, which is switchable via in-plane current through SOT;

forming a tunnel barrier layer;

forming a fixed layer; and forming a top electrode.

20. The method of claim 19, wherein $\alpha$ ranges from 20 to 50, $\beta$ ranges from 0 to 30, and $\gamma$ ranges from 40 to 60, and $\alpha+\beta+\gamma=100$.

* * * * *